US010665534B2

(12) United States Patent
Lee et al.

(10) Patent No.: US 10,665,534 B2
(45) Date of Patent: May 26, 2020

(54) SEMICONDUCTOR DEVICE AND METHOD OF USING PARTIAL WAFER SINGULATION FOR IMPROVED WAFER LEVEL EMBEDDED SYSTEM IN PACKAGE (71) Applicant: STATS ChipPAC Pte. Ltd., Singapore (SG)

(72) Inventors: KyungHoon Lee, Kyunggi-Do (KR); SangMi Park, Kyunggi-Do (KR); KyoungIl Huh, Kyunggi-Do (KR); DaeSik Choi, Seoul (KR)

(73) Assignee: JCET Semiconductor (Shaoxing) Co., Ltd. (CN)

( * ) Notice: Subject to any disclaimer, the term of this patent is extended or adjusted under 35 U.S.C. 154(b) by 0 days.

(21) Appl. No.: 15/705,543

(22) Filed: Sep. 15, 2017

(65) Prior Publication Data

US 2018/0019195 A1    Jan. 18, 2018

Related U.S. Application Data (62) Division of application No. 13/801,675, filed on Mar. 13, 2013, now Pat. No. 9,799,590.

(51) Int. Cl.
*H01L 23/498* (2006.01)
*H01L 25/065* (2006.01)
(Continued)

(52) U.S. Cl.
CPC ...... *H01L 23/49816* (2013.01); *H01L 21/561* (2013.01); *H01L 23/36* (2013.01);
(Continued)

(58) Field of Classification Search
CPC ......... H01L 23/49816; H01L 23/49822; H01L 25/0657
See application file for complete search history.

(56) References Cited

U.S. PATENT DOCUMENTS 6,204,562 B1   3/2001  Ho et al.
6,607,970 B1   8/2003  Wakabayashi
(Continued)

OTHER PUBLICATIONS

Kang, In-Soo et al., "Wafer Level Embedded System in Package (WL-eSiP) for Mobile Applications," 2010 Electronic Components Technology Conference, 2010 IEEE, pp. 309-315.

*Primary Examiner* — Tucker J Wright
*Assistant Examiner* — Wilner Jean Baptiste
(74) *Attorney, Agent, or Firm* — Brian M. Kaufman; Robert D. Atkins; Patent Law Group: Atkins and Associates, P.C.

(57) ABSTRACT

A semiconductor device includes a semiconductor wafer including a plurality of first semiconductor die. An opening is formed partially through the semiconductor wafer. A plurality of second semiconductor die is disposed over a first surface of the semiconductor wafer. An encapsulant is disposed over the semiconductor wafer and into the opening leaving a second surface of the semiconductor wafer exposed. A portion of the second surface of the semiconductor wafer is removed to separate the first semiconductor die. An interconnect structure is formed over the second semiconductor die and encapsulant. A thermal interface material is deposited over the second surface of the first semiconductor die. A heat spreader is disposed over the thermal interface material. An insulating layer is formed over the first surface of the semiconductor wafer. A vertical interconnect structure is formed around the first semiconductor die. Conductive vias are formed through the first semiconductor die.

18 Claims, 8 Drawing Sheets (51) Int. Cl.
    *H01L 21/56* (2006.01)
    *H01L 25/00* (2006.01)
    *H01L 23/00* (2006.01)
    *H01L 23/36* (2006.01)
    *H01L 23/31* (2006.01)

(52) U.S. Cl.
    CPC ........ *H01L 23/49822* (2013.01); *H01L 24/96* (2013.01); *H01L 24/97* (2013.01); *H01L 25/0657* (2013.01); *H01L 25/50* (2013.01); *H01L 23/3128* (2013.01); *H01L 2224/04105* (2013.01); *H01L 2224/11* (2013.01); *H01L 2224/12105* (2013.01); *H01L 2224/16145* (2013.01); *H01L 2224/16146* (2013.01); *H01L 2224/32145* (2013.01); *H01L 2224/32245* (2013.01); *H01L 2224/48091* (2013.01); *H01L 2224/73209* (2013.01); *H01L 2224/73253* (2013.01); *H01L 2224/73265* (2013.01); *H01L 2224/73267* (2013.01); *H01L 2224/81005* (2013.01); *H01L 2224/94* (2013.01); *H01L 2225/06513* (2013.01); *H01L 2225/06517* (2013.01); *H01L 2225/06541* (2013.01); *H01L 2225/06548* (2013.01); *H01L 2225/06582* (2013.01); *H01L 2225/06589* (2013.01); *H01L 2924/13091* (2013.01); *H01L 2924/181* (2013.01); *H01L 2924/18161* (2013.01); *H01L 2924/18162* (2013.01)

(56) References Cited

U.S. PATENT DOCUMENTS

| | | |
|---|---|---|
| 8,138,014 B2 | 3/2012 | Chi et al. |
| 2006/0113682 A1* | 6/2006 | Farnworth ............ H01L 21/561 257/782 |
| 2007/0108580 A1 | 5/2007 | Goller |
| 2008/0136004 A1 | 6/2008 | Yang et al. |
| 2009/0261460 A1 | 10/2009 | Kuan et al. |
| 2011/0186977 A1 | 8/2011 | Chi et al. |
| 2011/0285007 A1 | 11/2011 | Chi et al. |
| 2012/0012990 A1* | 1/2012 | Pagaila ................ H01L 21/561 257/659 |
| 2012/0018874 A1 | 1/2012 | Lin et al. |
| 2012/0038034 A1 | 2/2012 | Shin et al. |
| 2012/0187568 A1 | 7/2012 | Lin et al. |
| 2013/0093073 A1 | 4/2013 | Chen et al. |

* cited by examiner

SEMICONDUCTOR DEVICE AND METHOD OF USING PARTIAL WAFER SINGULATION FOR IMPROVED WAFER LEVEL EMBEDDED SYSTEM IN PACKAGE

CLAIM TO DOMESTIC PRIORITY

The present application is a division of U.S. patent application Ser. No. 13/801,675, now U.S. Pat. No. 9,799,590, filed Mar. 13, 2013, which application is incorporated herein by reference.

FIELD OF THE INVENTION

The present invention relates in general to semiconductor devices and, more particularly, to a semiconductor device and method of using partial singulation to reduce delamination and cracking in wafer level embedded system in packages (WL-eSiP).

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions. However, high frequency electrical devices generate or are susceptible to undesired electromagnetic interference (EMI) and radio frequency interference (RFI), harmonic distortion, or other inter-device interference, such as capacitive, inductive, or conductive coupling, also known as cross-talk, which can interfere with their operation.

Semiconductor devices often have limited heat dissipation. High frequency semiconductor devices generally generate more heat. Without effective heat dissipation, the generated heat can reduce performance, decrease reliability, and reduce the useful lifetime of the semiconductor device.

Semiconductor reliability is limited when devices suffer failure modes such as cracking. ESiP devices can suffer cracking and delamination between insulating materials and semiconductor die as a failure mode. The delamination and cracking failures result from high thermal stress, originating at the edge of the package and propagating to the inside of the package. The maximum stress point is usually found on the interface of the edge of a semiconductor die, between an insulating layer and encapsulant and between the molding compound layer and semiconductor die. Delamination and cracking result in a shorter life span for semiconductor devices.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisoprenes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photo-solubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1:
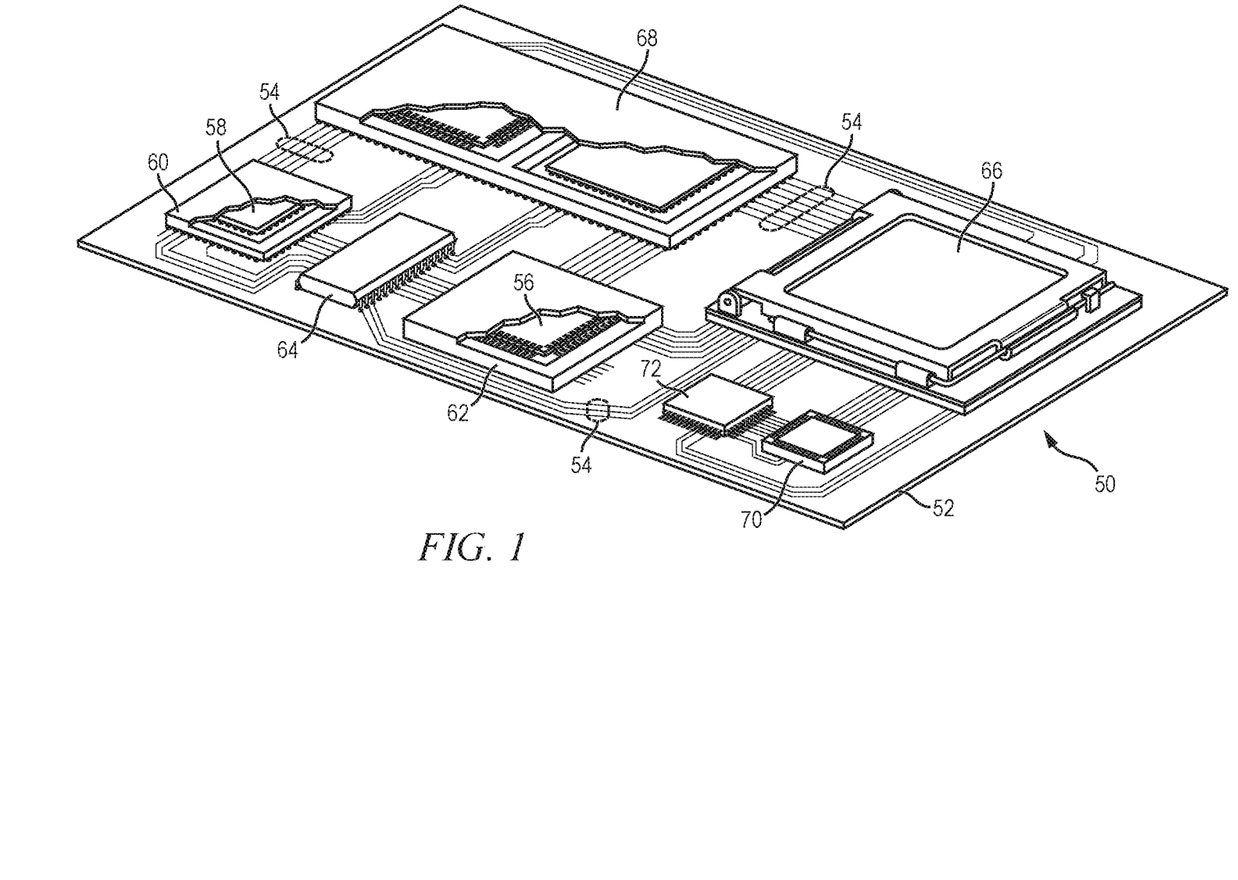
FIG. 1 illustrates a printed circuit board (PCB) with different types of packages mounted to a surface of the PCB.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for the products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
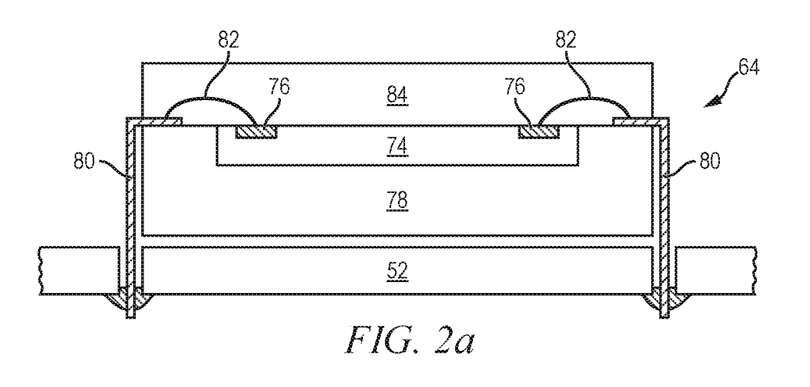
FIGS. 2a-2c illustrate further detail of the representative semiconductor packages mounted to the PCB.
Figure 2B:
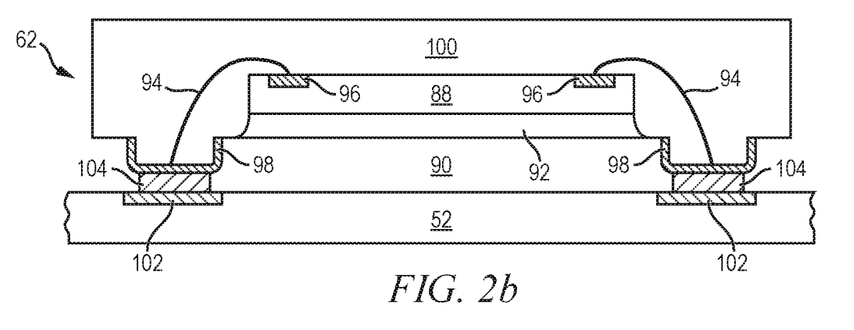
Figure 2C:
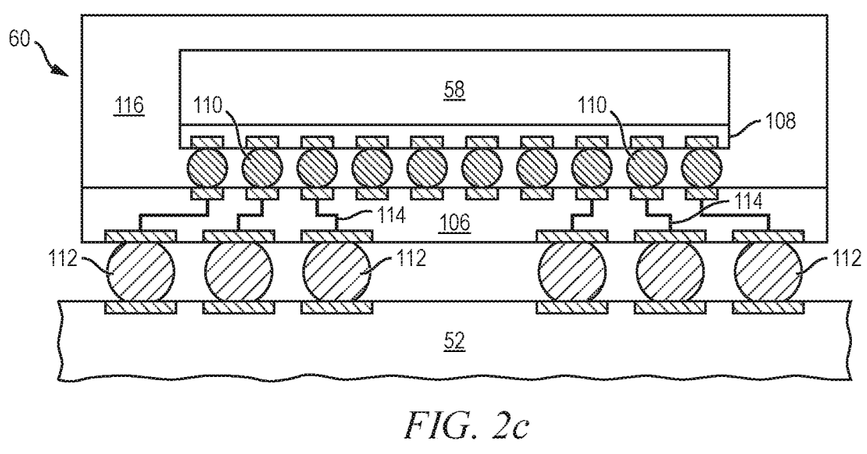

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
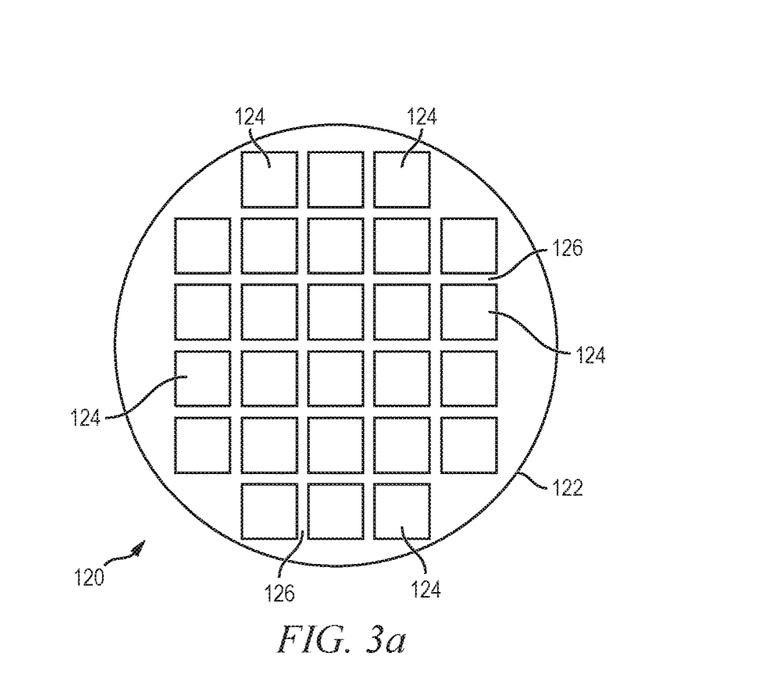
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
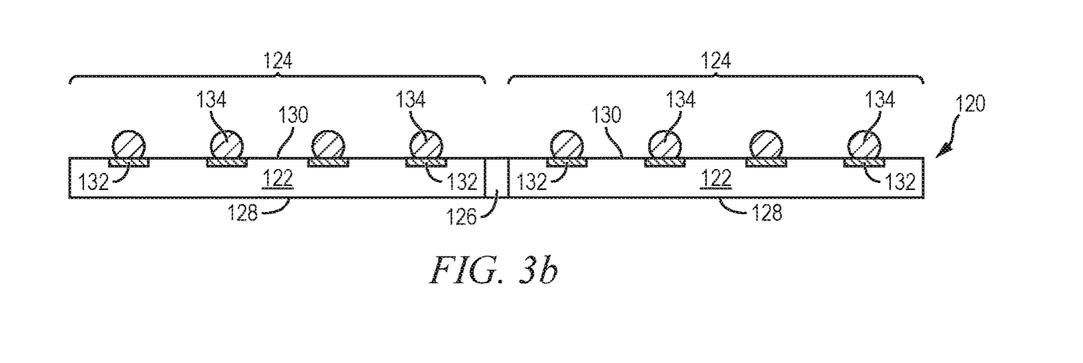

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type device.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

An electrically conductive bump material is deposited over contact pads 132 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 132 using a suitable attachment or bonding process. In one embodiment, the bump material is reflowed by heating the material above its melting point to form balls or bumps 134. In some applications, bumps 134 are reflowed a second time to improve electrical contact to contact pads 132. Bumps 134 can also be compression bonded or thermocompression bonded to contact pads 132. Bumps 134 represent one type of interconnect structure that can be formed over contact pads 132. The interconnect structure can also use stud bump, micro bump, or other electrical interconnect.

Figure 3C:
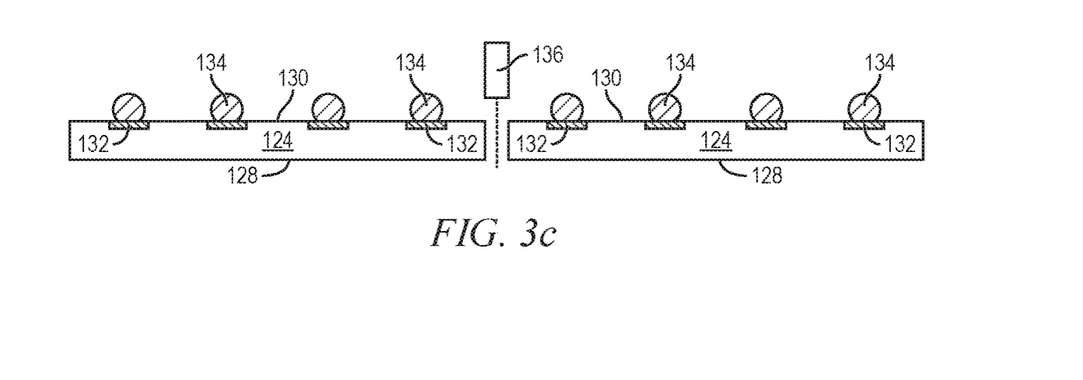

In FIG. 3c, semiconductor wafer 120 is singulated through saw street 126 using a saw blade or laser cutting tool 136 into individual semiconductor die 124.

Figure 4A:
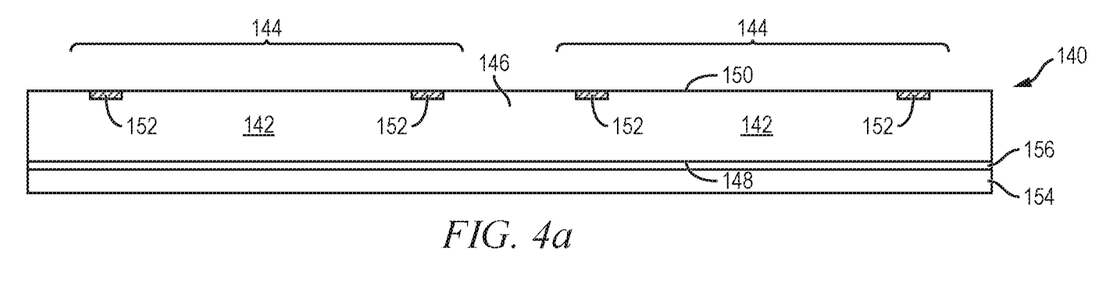
FIGS. 4a-4k illustrate a process of forming an embedded system-in-package device with reduced delamination and cracking.

FIGS. 4a-4k illustrate a semiconductor device and method of using partial singulation to reduce delamination and cracking in a wafer level embedded system in package. FIG. 4a shows a cross-sectional view of wafer or substrate 140 with a base substrate material 142, such as silicon, germanium, gallium arsenide, indium phosphide, or silicon carbide, for structural support. A plurality of semiconductor die or components 144 is formed on wafer 140 separated by a non-active, inter-die wafer area or saw street 146 as described above. Saw street 146 provides cutting areas to singulate wafer 140 into individual semiconductor die 144. Each semiconductor die 144 has a back surface 148 and active surface 150 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 150 to implement analog circuits or digital circuits, such as digital signal processor (DSP), ASIC, memory, or other signal processing circuit. Semiconductor die 144 may also contain integrated passive devices (IPDs), such as inductors, capacitors, and resistors, for RF signal processing. In one embodiment, semiconductor die 144 is a mother chip for an eSiP device.

A substrate or carrier 154 contains temporary or sacrificial base material such as silicon, germanium, gallium arsenide, indium phosphide, silicon carbide, resin, or other suitable low-cost, rigid material for structural support. An interface layer or double-sided tape 156 is formed over carrier 154 as a temporary adhesive bonding film or etch-stop layer. Substrate 140 is mounted to interface layer 156 over carrier 154.

Figure 4B:
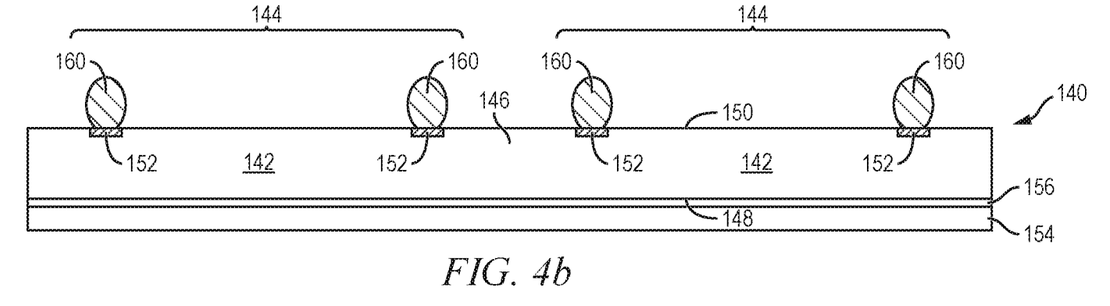

In FIG. 4b, an electrically conductive bump material is deposited over semiconductor die 144 and electrically connected to conductive layer 152 on surface 150 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 152 using a suitable attachment or bonding process. In one embodiment, the bump material is reflowed by heating the material above its melting point to form balls or bumps 160. In some applications, bumps 160 are reflowed a second time to improve electrical contact to conductive layer 152. An under bump metallization (UBM) layer can be formed under bumps 160. Bumps 160 can also be compression bonded to conductive layer 152. Bumps 160 represent one type of interconnect structure that can be formed over conductive layer 152. The interconnect structure can also use bond wires, stud bump, micro bump, or other electrical interconnect.

Figure 4C:
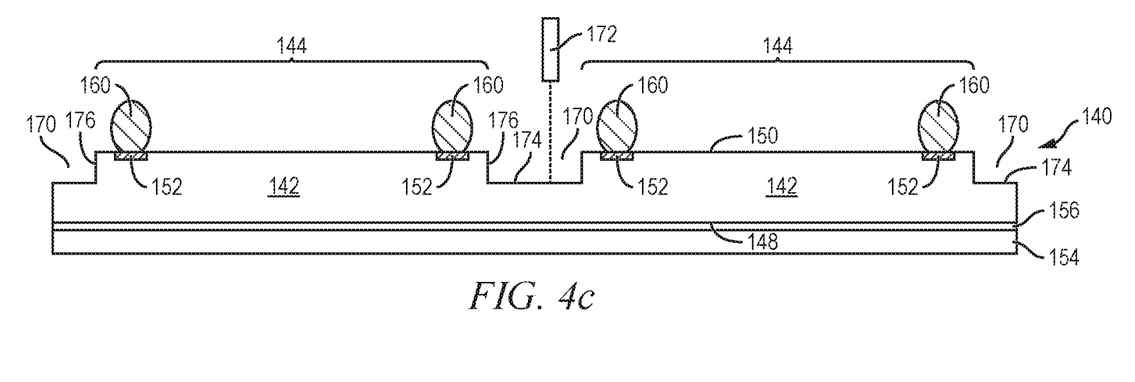

In FIG. 4c, after the formation of bumps 160, substrate or wafer 140 is partially singulated with saw blade or laser cutting device 172 by singulating partially through saw street 146 of wafer 140 to form opening 170 in the wafer and in a peripheral region around semiconductor die 144 and between adjacent semiconductor die 144. By partially singulating substrate 140 the upper surface 174 of saw street 146 and side surfaces 176 of semiconductor die 144 are exposed. Alternatively, wafer or substrate 140 is partially singulated after additional semiconductor die 124 are mounted to the substrate as shown in FIG. 4d.

Figure 4D:
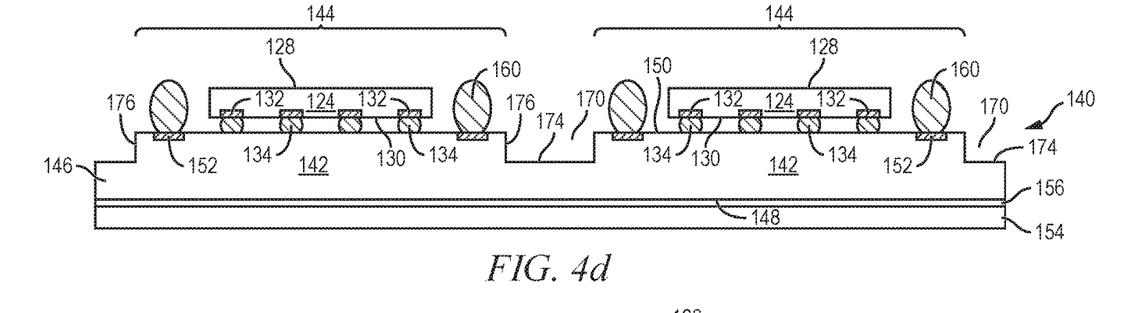

In FIG. 4d, semiconductor die 124 from FIGS. 3a-3c are positioned over and mounted to semiconductor die 144 of substrate or reconstituted wafer 140 using a pick and place operation. More specifically, bumps 134 are metallurgically and electrically connected to certain portions of semiconductor die 144, i.e., through contact pads of semiconductor die 144, depending on the electrical function of semiconductor die 124.

Figure 4E:
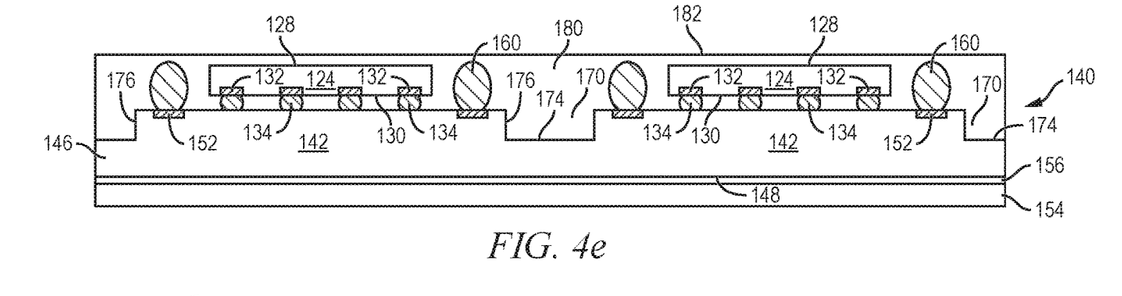

In FIG. 4e, an encapsulant or molding compound 180 is deposited over substrate 140, in opening 170 and a peripheral region around semiconductor die 144, and over and around semiconductor die 124 using a paste printing, compressive molding, transfer molding, liquid encapsulant molding, vacuum lamination, film-assisted molding, spin coating, or other suitable applicator. Encapsulant 180 is formed over back surface 128 of semiconductor die 124, and can be thinned in a subsequent backgrinding step. Encapsulant 180 can also be deposited such that the encapsulant is coplanar with back surface 128, and does not cover the back surface. Encapsulant 180 can be polymer composite material, such as epoxy resin with filler, epoxy acrylate with filler, or polymer with proper filler. Encapsulant 180 is non-conductive, provides physical support, and environmentally protects the semiconductor device from external elements and contaminants.

Figure 4F:
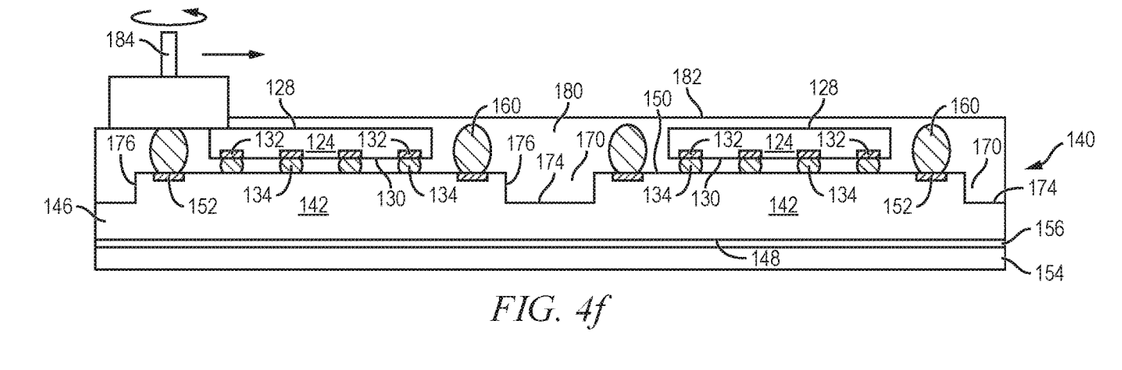

In FIG. 4f, surface 182 of encapsulant 180 undergoes a grinding operation with grinder 184 to planarize the surface and reduce thickness of the encapsulant. A chemical etch can also be used to remove and planarize encapsulant 180. A portion of encapsulant 180 is removed to thin the encapsulant. A portion of encapsulant 180 can also be removed to expose or thin the back surface of semiconductor die 124.

Figure 4G:
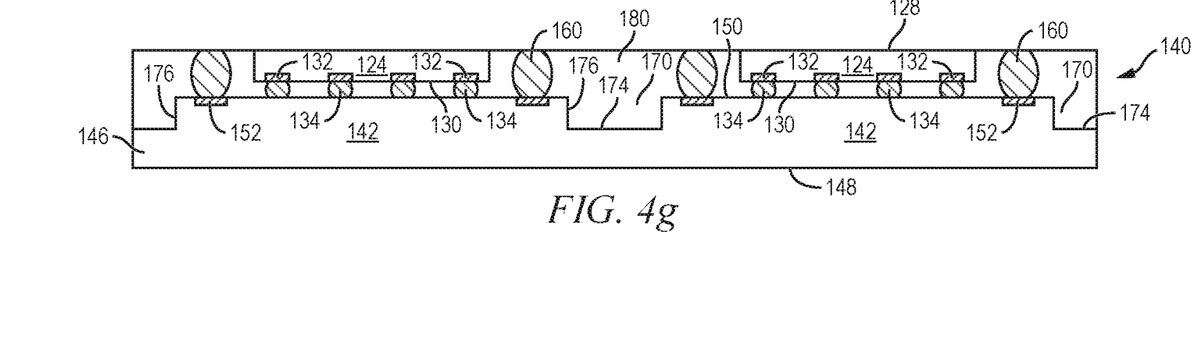

In FIG. 4g, carrier 154 and interface layer 156 are removed from substrate 140 by chemical etching, mechanical peeling, chemical mechanical planarization (CMP), mechanical grinding, thermal bake, UV light, laser scanning, or wet stripping to facilitate backgrinding or etching of back surface 148 of substrate 140 and semiconductor die 144.

Figure 4H:
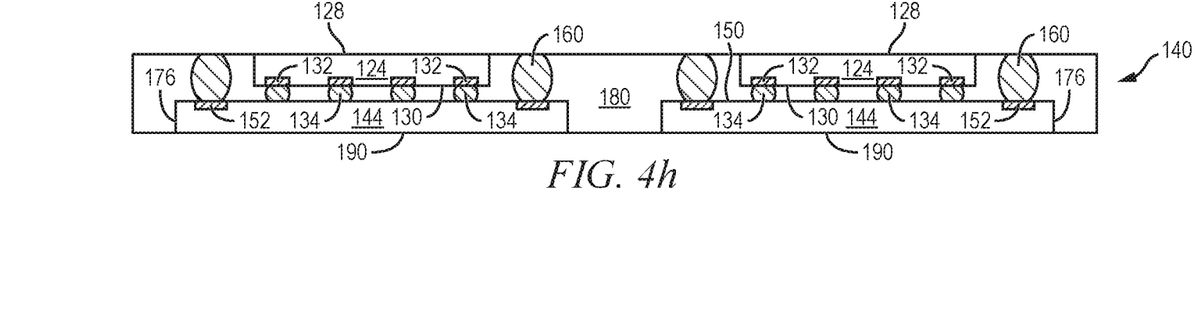

In FIG. 4h, a portion of back surface 148 of substrate 140, opposite active surface 150, is removed by a back-grinding or etching process to expose encapsulant 180 and planarize back surface 190 of wafer 140. The removal of back surface 148 of wafer 140 removes the remaining portion of saw street 146 to isolate semiconductor die 144. Semiconductor die 144 is surrounded by encapsulant 180 around side surface 176 to prevent delamination and cracking between semiconductor die 144 and encapsulant 180 over active surface 150. Back surface 190 of semiconductor die 144 remains exposed to improve heat dissipation. During a later singulation step, semiconductor devices are separated by cutting through encapsulant 180 in a peripheral region of semiconductor die 144 and opening 170 without cutting through wafer 140 to reduce chipping of semiconductor die 144.

Figure 4I:
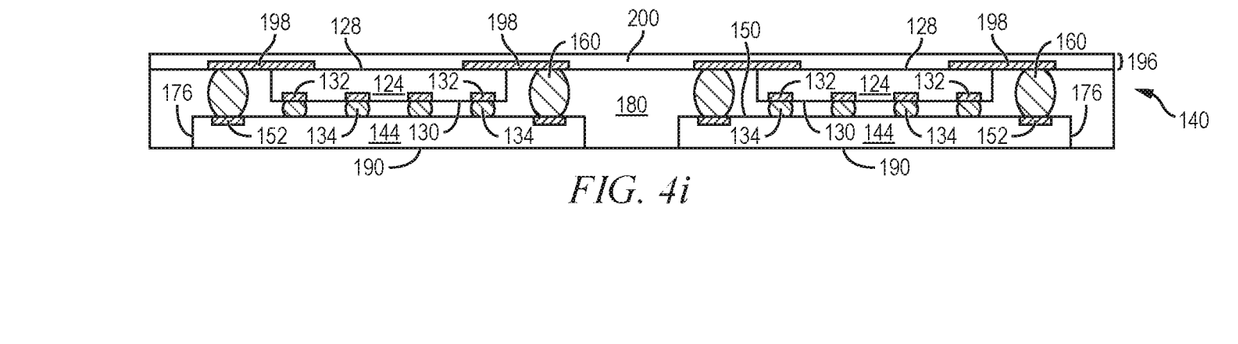

In FIG. 4i, a build-up interconnect structure 196 is formed over encapsulant 180 and back surface 128 of semiconductor die 124. Build-up interconnect structure 196 includes an electrically conductive layer or redistribution layer (RDL) 198 formed using a patterning and metal deposition process such as sputtering, electrolytic plating, and electroless plating. Conductive layer 198 can be one or more layers of Al, Cu, Sn, Ni, Au, Ag, or other suitable electrically conductive material. Conductive layer 198 is electrically connected to conductive layer 152 through bump or interconnect structure 160. Other portions of conductive layer 198 can be electrically common or electrically isolated depending on the design and function of semiconductor die 144. Build up interconnect structure 196 also includes insulating layer 200 formed over back surface 128 of semiconductor die 124 using PVD, CVD, screen printing, spin coating, spray coating, sintering or thermal oxidation. The insulating layer 200 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), or other material having similar insulating and structural properties. A portion of insulating layer 200 is removed by laser direct ablation (LDA) or other suitable process to form openings over conductive layer 198.

Figure 4J:
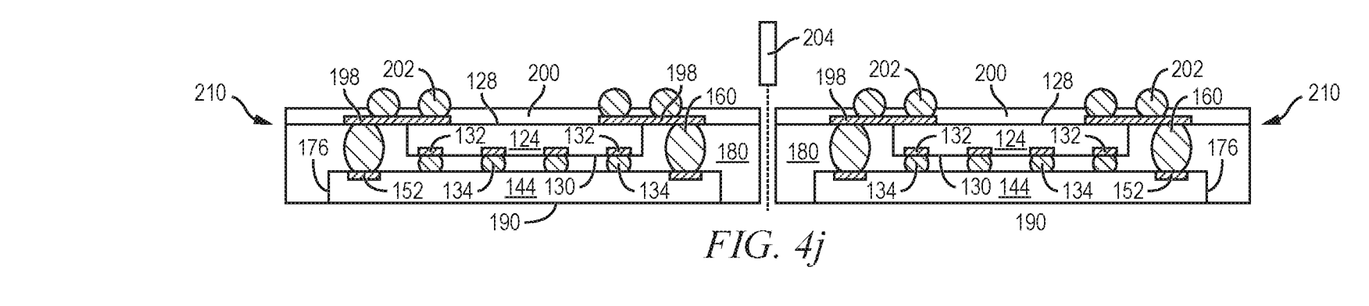

In FIG. 4j, an electrically conductive bump material is deposited over build-up interconnect structure 196 and electrically connected to conductive layer 198 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 198 using a suitable attachment or bonding process. In one embodiment, the bump material is reflowed by heating the material above its melting point to form balls or bumps 202. In some applications, bumps 202 are reflowed a second time to improve electrical contact to conductive layer 198. An under bump metallization (UBM) layer can be formed under bumps 202. Bumps 202 can also be compression bonded to conductive layer 198. Bumps 202 represent one type of interconnect structure that can be formed over conductive layer 198. The interconnect structure can also use bond wires, stud bump, micro bump, or other electrical interconnect.

After the formation of bumps 202, substrate or reconstituted wafer 140 is singulated through encapsulant 180 and opening 170 with saw blade or laser cutting device 204 to separate semiconductor devices 210 in FIG. 4j. Saw blade or laser cutting device 204 cuts a narrower opening through opening 170 in a peripheral region of semiconductor die 144 than saw blade or cutting device 172 in FIG. 4c, so that side surfaces 176 of semiconductor die 144 remain intact and a portion of encapsulant 180 remains over side surface 176 after singulation to reduce delamination over surface 150 of semiconductor die 144.

Figure 4K:
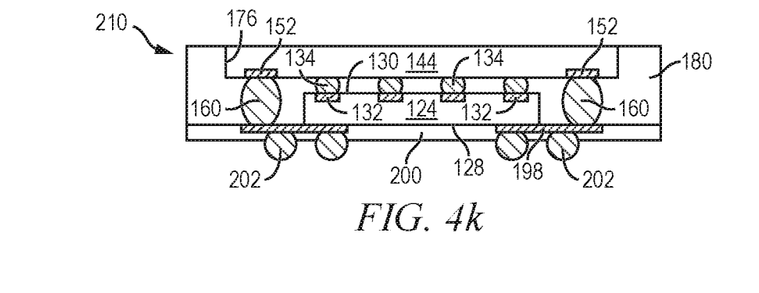

FIG. 4k shows an individual semiconductor device 210 after singulation. Semiconductor device 210 is an eSiP structure. The use of partial sawing on wafer 140, then depositing encapsulant 180 over wafer 140, then etching the backside of wafer 140 to separate semiconductor die 144 enables surrounding semiconductor die 144 with encapsulant 180 to reduce cracking and delamination. In one embodiment, semiconductor device 210 is surrounded by encapsulant 180 to prevent delamination and cracking of insulating material or encapsulant at surface 150 of semiconductor die 144. Semiconductor device 210 also has improved thermal characteristics due to the exposed back surface 190 of flipchip semiconductor die 144.

Figure 5:
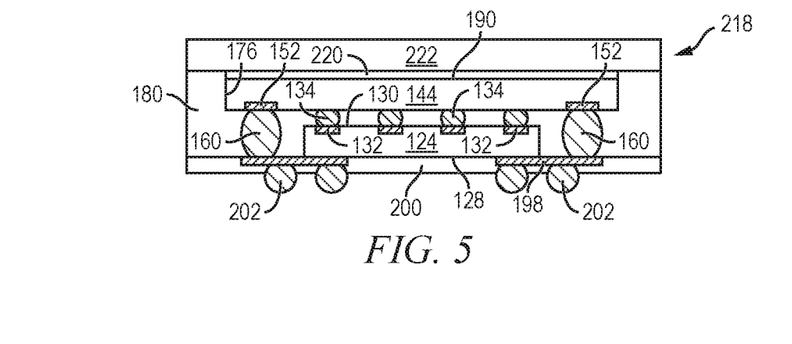
FIG. 5 illustrates another embodiment of an eSiP with a thermal interface material and thermal heat spreader.

FIG. 5 illustrates another embodiment of WL-eSiP semiconductor device 218, similar to FIG. 4k, with a thermal interface material (TIM) 220 deposited over back surface 190 of semiconductor die 144. TIM 220 is a thermal epoxy, thermal epoxy resin, or thermal conductive paste. Heat spreader or heat sink 222 is positioned over and mounted to TIM 220 over back surface 190 of semiconductor die 144. Heat spreader 222 can be Cu, Al, or other material with high thermal conductivity. Heat spreader 222 and TIM 220 form a thermally conductive path that distributes and dissipates the heat generated by the high frequency electronic components of semiconductor die 144 and increases the thermal performance of semiconductor package 218. The heat is dissipated radially from heat spreader 222. Semiconductor die 144 is surrounded by encapsulant 180 to reduce delamination and cracking of insulating material over active surface 150 of semiconductor die 144.

Figure 6:
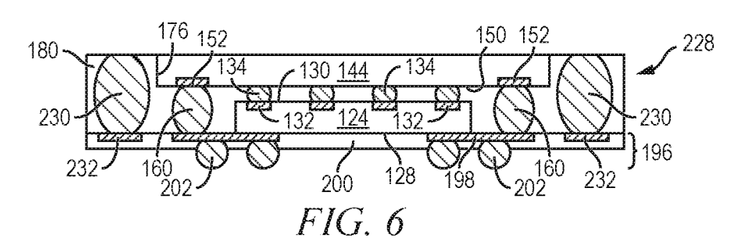
FIG. 6 illustrates another embodiment of an eSiP device with vertical interconnects formed through the encapsulant.

FIG. 6 illustrates another embodiment of WL-eSiP semiconductor device 228, similar to FIG. 4k, with bump or vertical interconnect structure 230 formed around a peripheral region of semiconductor die 124 and 144. An electrically conductive bump material is deposited over conductive layer 232 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 232 using a suitable attachment or bonding process. In one embodiment, the bump material is reflowed by heating the material above its melting point to form balls or bumps 230. In some applications, bumps 230 are reflowed a second time to improve electrical contact to contact pads 232. Bumps 230 can also be compression bonded or thermocompression bonded to conductive layer 232. Bumps 230 represent one type of interconnect structure that can be formed over contact pads 232. The interconnect structure can also use stud bump, micro bump, conductive columns, composite interconnects, or other electrical interconnect. A height of bumps 230 is determined by a desired final package height as well as other factors. Semiconductor die 144 is surrounded by encapsulant 180 to reduce delamination and cracking over active surface 150 of semiconductor die 144.

Figure 7:
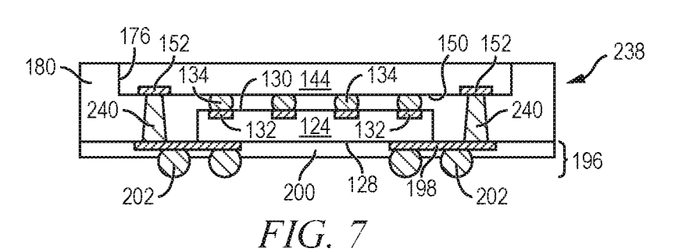
FIG. 7 illustrates another embodiment of an eSiP device with vias formed by laser direct ablation (LDA) and a conductive material deposited in the vias.

FIG. 7 illustrates another embodiment of semiconductor device 238, similar to FIG. 4k, with a vertical interconnect 240 electrically connecting conductive layer 198 of interconnect structure 196 and conductive layer 152 of semiconductor die 144. An opening is formed in encapsulant 180 over conductive layer 152 prior to formation of interconnect structure 196 by laser direct ablation (LDA). Conductive material is deposited in the opening to form interconnect structure 240. Interconnect structure 196 is formed over interconnect structure 240, encapsulant 180, and semiconductor die 124. Semiconductor die 144 is surrounded by encapsulant 180 to reduce delamination and cracking over active surface 150 of semiconductor die 144 by extending encapsulant over side surface 176 of semiconductor die 144. Exposed back surface of semiconductor die 144 provides improved thermal characteristics.

Figure 8:
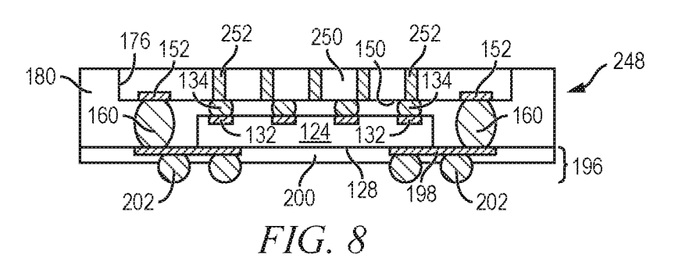
FIG. 8 illustrates an eSiP device with a substrate having conductive vias.

FIG. 8 illustrates another embodiment of semiconductor device 248, similar to FIG. 4k, with substrate 250 including a base substrate material, such as metal, silicon, polymer, polymer composite, ceramic, glass, glass epoxy, beryllium oxide, or other suitable low-cost, rigid material or bulk semiconductor material for structural support. A plurality of vias is formed through substrate 250 using laser drilling, mechanical drilling, or deep reactive ion etching (DRIE). The vias are filled with Al, Cu, Sn, Ni, Au, Ag, titanium (Ti), tungsten (W), poly-silicon, or other suitable electrically conductive material using electrolytic plating, electroless plating process, or other suitable metal deposition process to form vertical interconnect conductive vias 252. Substrate 250 is surrounded by encapsulant 180 to reduce delamination and cracking between substrate 250 and encapsulant 180 by extending encapsulant over a side surface of substrate 250.

Figure 9:
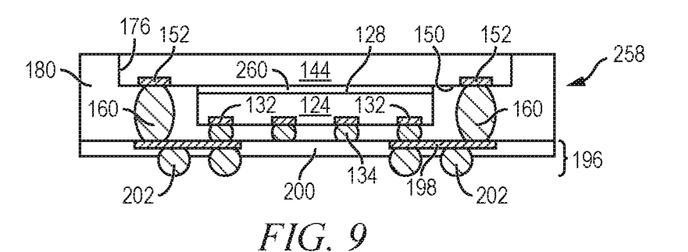
FIG. 9 illustrates an embodiment of an eSiP device including a die attach adhesive between the semiconductor die.

FIG. 9 illustrates another embodiment of semiconductor device 258, similar to FIG. 4k, with an adhesive material 260. Adhesive material 260 is deposited over back surface 128 of semiconductor die 124 to attach to active surface 150 of semiconductor die 144. Active surface of semiconductor die 124 is oriented toward interconnect structure 196 and electrically connected through bumps 134 according to the function and design of semiconductor die 124. Semiconductor die 144 is surrounded by encapsulant 180 to reduce delamination and cracking over active surface 150 of semiconductor die 144 by extending encapsulant over side surface 176 of semiconductor die 144.

Figure 10:
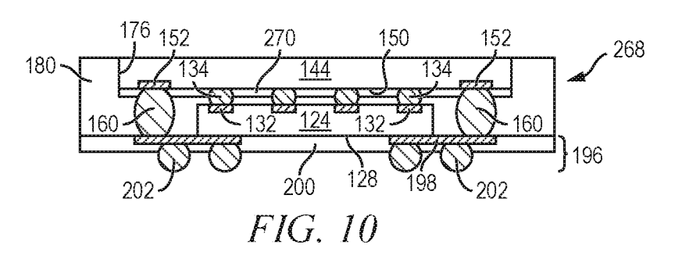
FIG. 10 illustrates an embodiment of an eSiP device including an insulating layer formed over a semiconductor die and surrounded by encapsulant.

FIG. 10 illustrates another embodiment of semiconductor device 268, similar to FIG. 4k, with an insulating layer 270 formed over active surface 150 of semiconductor die 144. Openings are formed in insulating layer 270 to electrically connect die 144 through interconnect structure 134 to semiconductor die 124, depending on the electrical function of semiconductor die 124. Encapsulant 180 is formed over die 144 and insulating layer 270 and around die 144 and insulating layer 270 to reduce delamination and cracking between die 144, insulating layer 270, and encapsulant 180. Encapsulant 180 surrounding die 144 reduces cracking and delamination of encapsulant 180 and insulating layer 270 and between die 144 and insulating layer 270 by extending encapsulant over side surface 176 of semiconductor die 144. Exposed flipchip semiconductor die 144 of semiconductor device 268 also improves thermal characteristics of semiconductor device 268 to reduce thermal stress over semiconductor die 144.

By forming encapsulant around semiconductor die 144, performance of eSiP during thermal cycling is improved by extending encapsulant over side surface 176 and increasing support over active surface 150 of semiconductor die 144 to prevent delamination and cracking failures. By exposing a back surface of semiconductor die 144 to improve thermal characteristics, stress and strain caused along surface 150 by adjacent materials with differing coefficients of thermal expansion (CTEs) is reduced. Thus, delamination and cracking between semiconductor die 144, encapsulant 180, and insulating layer 270 is prevented. Specifically, the stress in the eSiP device is reduced at areas of high stress concentration, including along edges of surface 150 of semiconductor die 144.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
a semiconductor wafer including a plurality of first semiconductor die and a trench formed between the plurality of first semiconductor die;
an insulating layer formed over the plurality of first semiconductor die, wherein the insulating layer extends to the trench;
a plurality of second semiconductor die disposed over the plurality of first semiconductor die;
a plurality of first conductive bumps disposed over the plurality of first semiconductor die and outside a footprint of the plurality of second semiconductor die in openings of the insulating layer, wherein a height of the plurality of first conductive bumps is greater than a height of the plurality of second semiconductor die; and
an encapsulant deposited over the semiconductor wafer, the plurality of second semiconductor die, and the plurality of first conductive bumps, wherein the encapsulant extends into the trench and between the insulating layer and plurality of second semiconductor die.

2. The semiconductor device of claim 1, wherein the plurality of second semiconductor die and the plurality of first conductive bumps are exposed from the encapsulant.

3. The semiconductor device of claim 2, wherein top surfaces of the plurality of first conductive bumps are coplanar with a top surface of the encapsulant.

4. The semiconductor device of claim 1, further including a plurality of second conductive bumps disposed between the plurality of first semiconductor die and the plurality of second semiconductor die.

5. The semiconductor device of claim 1, wherein the encapsulant fills the trench.

6. The semiconductor device of claim 1, further including a second conductive bump disposed in the trench.

7. A semiconductor device, comprising:
a semiconductor wafer including a plurality of first semiconductor die and a trench formed between the plurality of first semiconductor die;
an insulating layer formed over the plurality of first semiconductor die, wherein the insulating layer extends to the trench
a plurality of second semiconductor die disposed over the plurality of first semiconductor die;
a plurality of first conductive bumps disposed over the plurality of first semiconductor die and outside of a footprint of the plurality of second semiconductor die; and
an encapsulant deposited over the semiconductor wafer, plurality of second semiconductor die, and plurality of first conductive bumps, wherein the encapsulant extends into the trench and between the insulating layer and plurality of second semiconductor die.

8. The semiconductor device of claim 7, wherein the first conductive bumps are exposed from the encapsulant.

9. The semiconductor device of claim 8, wherein a top surface of the first conductive bumps is coplanar with a top surface of the encapsulant.

10. The semiconductor device of claim 7, further including a plurality of second conductive bumps disposed between the plurality of first semiconductor die and the plurality of second semiconductor die.

11. The semiconductor device of claim 7, wherein the encapsulant fills the trench.

12. The semiconductor device of claim 7, further including a second conductive bump disposed in the trench.

13. A semiconductor device, comprising:
a semiconductor wafer including a plurality of first semiconductor die and a trench formed between the plurality of first semiconductor die;
a plurality of second semiconductor die disposed over the plurality of first semiconductor die;
a plurality of first conductive bumps disposed over the plurality of first semiconductor die;
a plurality of second conductive bumps disposed outside a footprint of the first semiconductor die and outside a footprint of the second semiconductor die; and
an encapsulant deposited over the semiconductor wafer, plurality of second semiconductor die, plurality of first conductive bumps, and plurality of second conductive bumps, wherein the encapsulant extends into the trench and contacts the first conductive bumps and second conductive bumps.

14. The semiconductor device of claim 13, wherein a height of the plurality of first conductive bumps is greater than a height of the plurality of second semiconductor die.

15. The semiconductor device of claim 13, wherein top surfaces of the plurality of first conductive bumps are coplanar with top surfaces of the plurality of second semiconductor die.

16. The semiconductor device of claim 13, further including a plurality of third conductive bumps disposed between the plurality of first semiconductor die and the plurality of second semiconductor die.

17. The semiconductor device of claim 13, wherein the second conductive bumps are disposed in the trench.

18. The semiconductor device of claim 13, further including an insulating layer formed over the plurality of first semiconductor die, wherein the encapsulant extends between the insulating layer and plurality of second semiconductor die.

* * * * *